(12) United States Patent
Kang et al.

(10) Patent No.: US 12,354,935 B2
(45) Date of Patent: Jul. 8, 2025

(54) INTEGRATED CIRCUIT (IC) PACKAGE SUBSTRATE WITH EMBEDDED TRACE SUBSTRATE (ETS) LAYER ON A SUBSTRATE, AND RELATED FABRICATION METHODS

(71) Applicant: QUALCOMM Incorporated, San Diego, CA (US)

(72) Inventors: Kuiwon Kang, San Diego, CA (US); Chin-Kwan Kim, San Diego, CA (US); Joonsuk Park, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 708 days.

(21) Appl. No.: 17/405,494

(22) Filed: Aug. 18, 2021

(65) Prior Publication Data

US 2022/0068780 A1     Mar. 3, 2022

Related U.S. Application Data

(60) Provisional application No. 63/070,048, filed on Aug. 25, 2020.

(51) Int. Cl.
*H01L 23/498* (2006.01)
*H01L 21/48* (2006.01)
*H01L 23/00* (2006.01)

(52) U.S. Cl.
CPC .... *H01L 23/49822* (2013.01); *H01L 21/4857* (2013.01); *H01L 23/49811* (2013.01);
(Continued)

(58) Field of Classification Search
None
See application file for complete search history.

(56) References Cited

U.S. PATENT DOCUMENTS

2005/0185880 A1* 8/2005 Asai ..................... H05K 1/0274
                                                          385/14
2007/0145367 A1  6/2007 Chen et al.
(Continued)

FOREIGN PATENT DOCUMENTS

TW     201709354 A    3/2017
WO     2020009827 A1  1/2020

OTHER PUBLICATIONS

International Search Report and Written Opinion for International Patent Application No. PCT/US2021/046686, mailed Dec. 2, 2021, 14 pages.
(Continued)

*Primary Examiner* — Hung K Vu
(74) *Attorney, Agent, or Firm* — Withrow & Terranova, PLLC

(57) ABSTRACT

Integrated circuit (IC) package substrate with an embedded trace substrate (ETS) layer on a substrate, and related fabrication methods. The package substrate of the IC package includes an ETS layer provided on the substrate to facilitate providing higher density substrate interconnects to provide bump/solder joints for coupling a semiconductor die to the package substrate. ETS interconnects in the ETS layer in the package substrate facilitates die connections having a reduced line-spacing ratio (L/S) (e.g., 5.0 micrometers (μm)/ 5.0 μm or less) over substrate interconnects in a substrate. In additional exemplary aspects, raised metal pillar interconnects are formed in contact with respective ETS interconnects of the ETS layer of the package substrate to avoid or reduce metal consumption by die solder disposed on metal pillar interconnects of the ETS layer providing bump/solder joints.

19 Claims, 11 Drawing Sheets

(52) U.S. Cl.
CPC .............. *H01L 24/16* (2013.01); *H01L 24/81* (2013.01); *H01L 2224/16227* (2013.01); *H01L 2224/81801* (2013.01)

(56) References Cited

U.S. PATENT DOCUMENTS

| | | |
|---|---|---|
| 2018/0130759 A1 | 5/2018 | Ho et al. |
| 2019/0035753 A1 | 1/2019 | Shih et al. |
| 2020/0013706 A1 | 1/2020 | Kang et al. |
| 2020/0051907 A1 | 2/2020 | Kang et al. |

OTHER PUBLICATIONS

Search Report for Taiwan Patent Application No. 110130641, mailed Nov. 6, 2024, 1 page.

\* cited by examiner

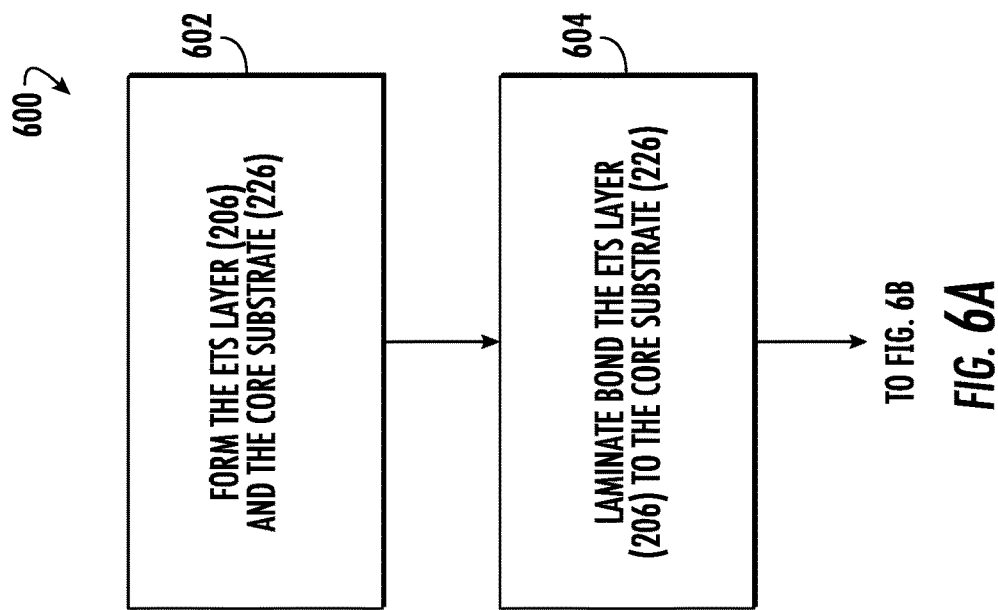
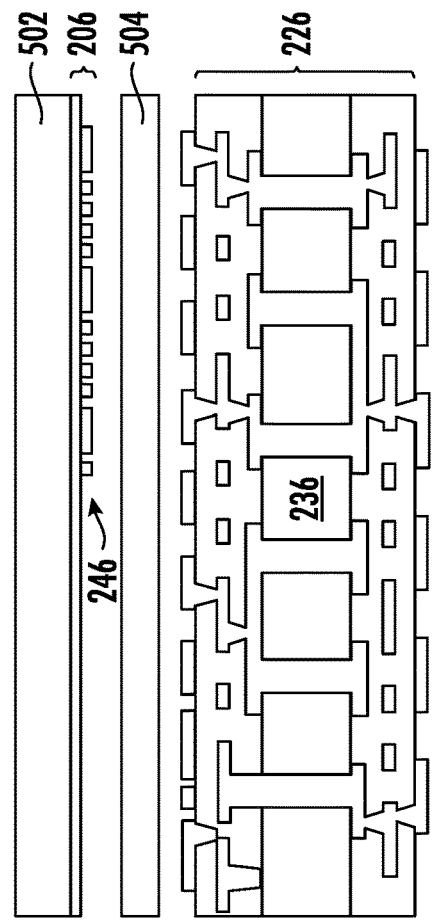
FIG. 5A
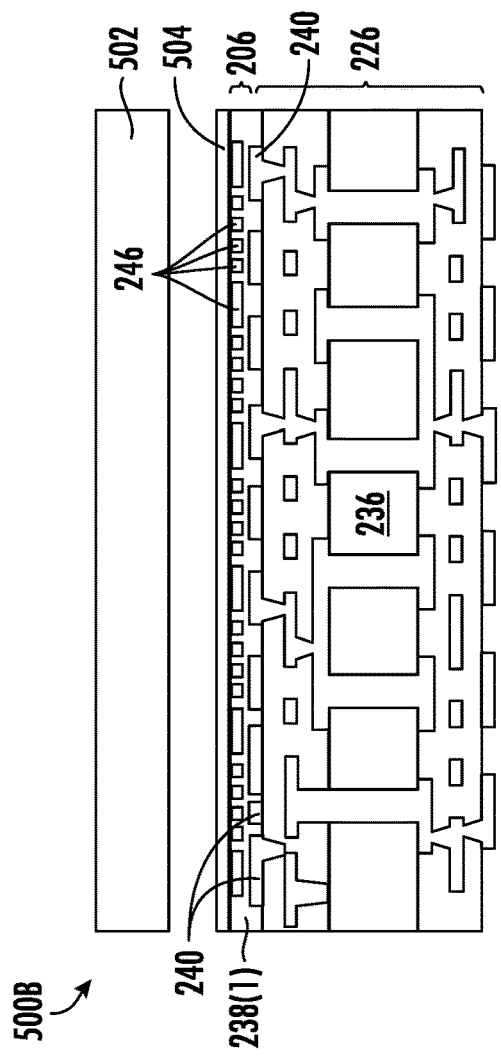
FIG. 5B

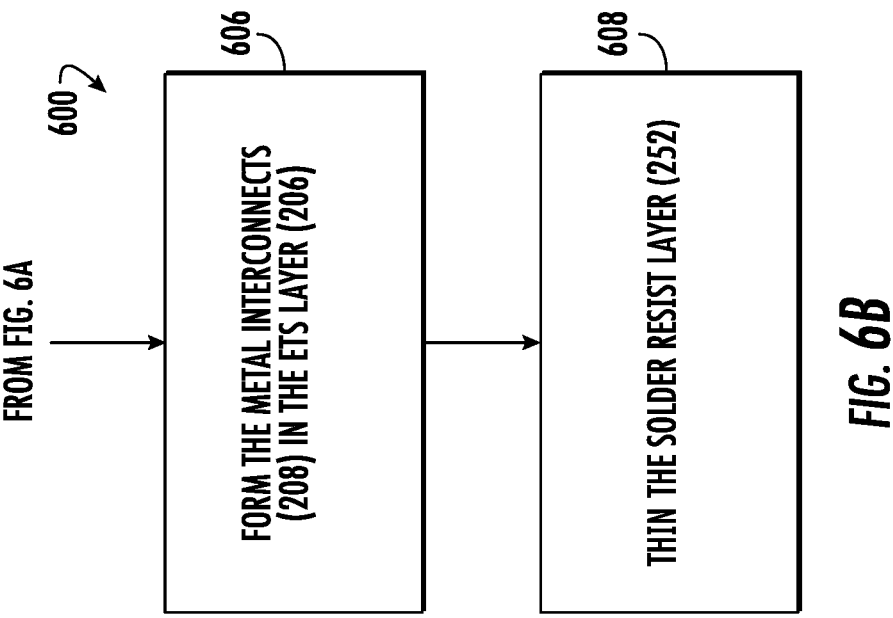
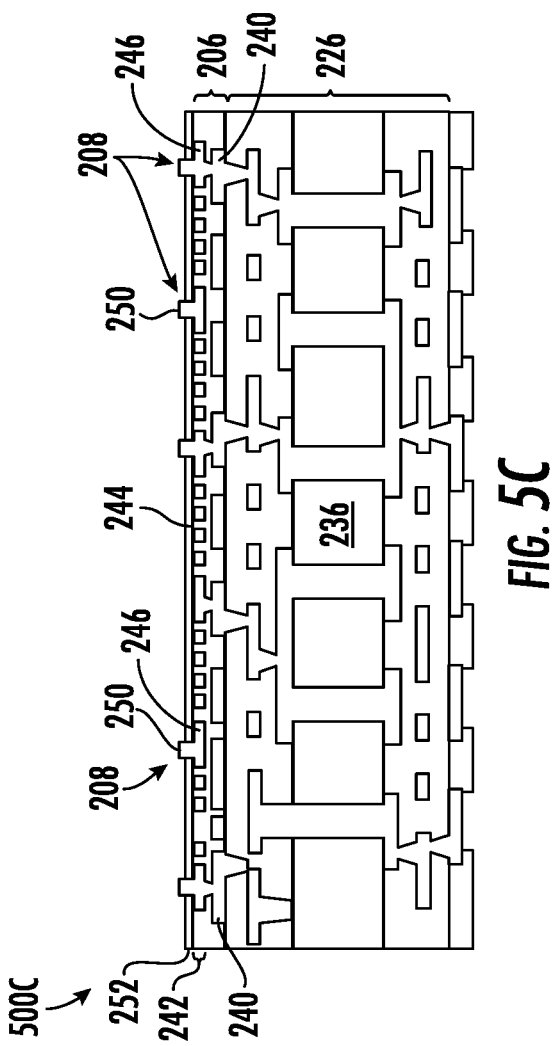
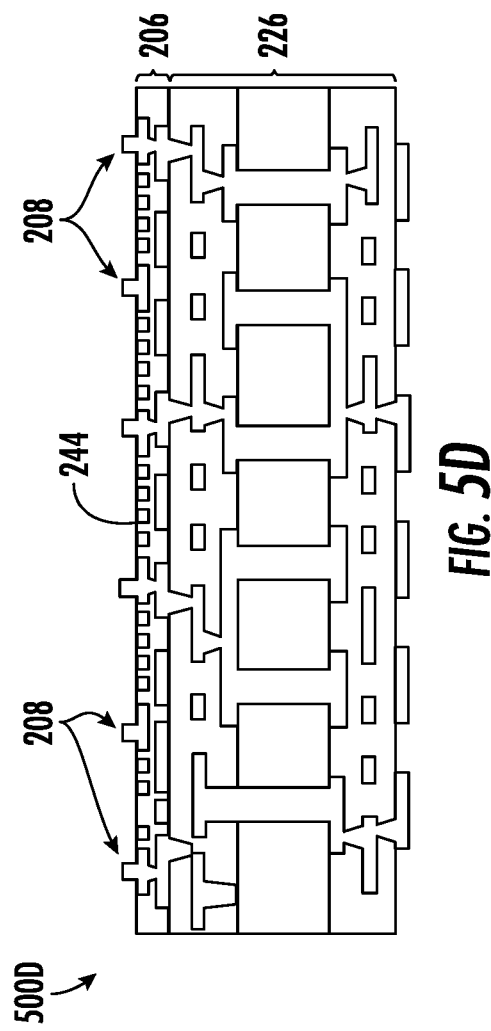

INTEGRATED CIRCUIT (IC) PACKAGE SUBSTRATE WITH EMBEDDED TRACE SUBSTRATE (ETS) LAYER ON A SUBSTRATE, AND RELATED FABRICATION METHODS

PRIORITY APPLICATION

The present application claims priority under 35 U.S.C. § 119(e) to U.S. Provisional Patent Application Ser. No. 63/070,048, filed Aug. 25, 2020 and entitled "INTEGRATED CIRCUIT (IC) PACKAGES EMPLOYING CORELESS SUBSTRATE WITH RAISED METAL PILLAR INTERCONNECTS FOR PROVIDING INTERCONNECTIONS TO AN IC DIE, AND RELATED FABRICATION METHODS," which is incorporated herein by reference in its entirety.

BACKGROUND

I. Field of the Disclosure

The field of the disclosure relates to integrated circuit (IC) packages that include one or more semiconductor dies attached to a package substrate that provides an electrical interface to the semiconductor dice to provide a die-to-die interconnection.

II. Background

Integrated circuits (ICs) are the cornerstone of electronic devices. ICs are packaged in an IC package, also called a "semiconductor package" or "chip package." The IC package includes one or more semiconductor dies, also referred to as "IC dies" or "dies." The dies are mounted on and electrically coupled to a package substrate to provide physical support and an electrical interface to the semiconductor die(s). The package substrate may be a coreless embedded trace substrate (ETS), for example, that includes embedded electrical traces in one or more dielectric layers and vertical interconnect accesses (vias) coupling the electrical traces together to provide electrical interfaces between the semiconductor die(s). The semiconductor die(s) is mounted to and electrically interfaced to interconnects exposed in a top or outer layer of the package substrate to electrically couple the semiconductor die(s) to the electrical traces of the package substrate.

The semiconductor die(s) and package substrate are encapsulated in a package material, such as a molding compound, to form the IC package. The IC package may also include external solder balls in a ball grid array (BGA) that are electrically coupled to interconnects exposed in a bottom layer of the package substrate to electrically couple the solder balls to the electrical traces in the package substrate. The solder balls provide an external electrical interface to the semiconductor die(s) in the IC package. The solder balls are electrically coupled to metal contacts on a printed circuit board (PCB) when the IC package is mounted to the PCB to provide an electrical interface between electrical traces in the PCB to the IC chip through the package substrate in the IC package.

SUMMARY OF THE DISCLOSURE

Aspects disclosed herein include integrated circuit (IC) package substrate with an embedded trace substrate (ETS) layer on a substrate. Related fabrication methods are also disclosed. The substrate can be a cored or coreless substrate. In exemplary aspects, a package substrate of the IC package includes an ETS layer disposed on the substrate to facilitate providing higher density ETS interconnects to provide bump/solder joints for coupling a semiconductor die (also referred to as "IC die" or "die") to the package substrate. The ETS layer is a coreless structure that includes metal traces embedded in a dielectric material for signal routing. Metal ETS interconnects are formed in the ETS layer that are coupled to the metal traces therein to provide ETS interconnects for bump/solder joints for coupling a semiconductor die to the package substrate. Providing the ETS interconnects for die connections in an ETS layer in the package substrate can facilitate the ETS interconnects having a reduced line-spacing ratio (L/S) (e.g., 5.0 micrometers (μm)/ 5.0 μm or less) over substrate interconnects in a substrate. This can be useful for high die interconnect density IC package applications, including without limitation split die IC packages that use upper layers of the substrate to form die-to-die connections. However, the reduced sized ETS interconnects in the ETS layer can be more easily "consumed" by die solder when coupled to a die, known as "metal consumption." Metal consumption can increase the risk of cracking the ETS layer, which if occurred, could reduce the quality and/or destroy interconnections between the package substrate and a semiconductor die(s). Thus, in additional exemplary aspects, raised metal pillar interconnects (e.g., metal posts, vertical interconnect accesses (vias)) are formed in contact with respective ETS interconnects of the ETS layer of the package substrate. The metal pillar interconnects are raised above an outer surface of the ETS layer so that the metal pillar interconnects are of an increased height and thus increased volume to reduce or avoid metal consumption. Thus, providing the raised metal pillar interconnects in an ETS layer disposed on a substrate in an IC package can reduce or avoid metal consumption and support ETS interconnects of a smaller US to support dies with higher connection density dies with reduced or avoided metal consumption.

In other exemplary aspects, the metal pillar interconnects coupled to the ETS layer are used as the structure to provide interconnection to the substrate interconnect interface of the package substrate to a die, because the ETS interconnects formed in the ETS layer are formed by a patterning process. This may make it easier to form the ETS interconnects to provide the ETS interconnects of a smaller L/S. The raised metal pillar interconnects can be formed by patterning a top or outer surface of the ETS layer to form openings above and through the thinner metal interconnects of the ETS layer to form the raised metal pillar interconnects. A metal material (e.g., copper) can be disposed in the openings to form the raised metal pillar interconnects as vias as an example, with a raised metal interconnect portion as one body coupled to the thinner ETS interconnects disposed below. This forms an electrical connection between the metal pillar interconnects and ETS interconnects in the ETS layer and to substrate interconnects in the package substrate.

In one exemplary aspect, a package substrate for an IC package is provided. The package substrate comprises a substrate comprising an upper substrate metallization layer comprising one or more substrate metal interconnects and an ETS layer coupled to the substrate. The ETS layer comprises an ETS interconnect layer adjacent to the upper substrate metallization layer of the substrate, the ETS interconnect layer comprising one or more ETS interconnects. Each ETS interconnect among the one or more ETS interconnects coupled to a substrate metal interconnect among the one or more substrate metal interconnects in the upper substrate metallization layer of the substrate.

In another exemplary aspect, an IC package is provided. The IC package comprises a package substrate comprising a substrate comprising an upper substrate metallization layer comprising one or more substrate metal interconnects. The package substrate also comprises an ETS layer coupled to the substrate. The ETS layer comprises an ETS interconnect layer adjacent to the upper substrate metallization layer of the package substrate, the ETS interconnect layer comprising one or more ETS interconnects. Each ETS interconnect among the one or more ETS interconnects coupled to a substrate metal interconnect among the one or more substrate metal interconnects in the upper substrate metallization layer of the substrate. The IC package also comprises a die coupled to at least one ETS interconnect among the one or more ETS interconnects in the ETS layer.

In another exemplary aspect, a method of fabricating a substrate for an IC package is provided. The method comprises forming a substrate comprising an upper substrate metallization layer comprising one or more substrate metal interconnects. The method also comprises forming an ETS layer coupled to the substrate, the ETS layer comprising an ETS interconnect layer adjacent to the upper substrate metallization layer of the substrate, the ETS interconnect layer comprising one or more ETS interconnects. The method also comprises disposing the ETS layer on the substrate adjacent to the upper substrate metallization layer coupling each ETS interconnect among the one or more ETS interconnects coupled to a substrate metal interconnect among the one or more substrate metal interconnects in the upper substrate metallization layer of the substrate.

BRIEF DESCRIPTION OF THE FIGURES

FIGS. 5A-5D illustrate exemplary fabrication stages during fabrication of the package substrate in FIGS. 2A and 2B that includes an embedded trace substrate (ETS) layer on a substrate, wherein the ETS layer includes raised metal pillar interconnects for facilitating interconnections to one or more dies coupled to the package substrate;

FIGS. 6A and 6B are a flowchart illustrating another exemplary process of fabricating the package substrate in FIGS. 2A and 2B according to the exemplary fabrication stages in FIGS. 5A-5D;

DETAILED DESCRIPTION

Figure 1A:
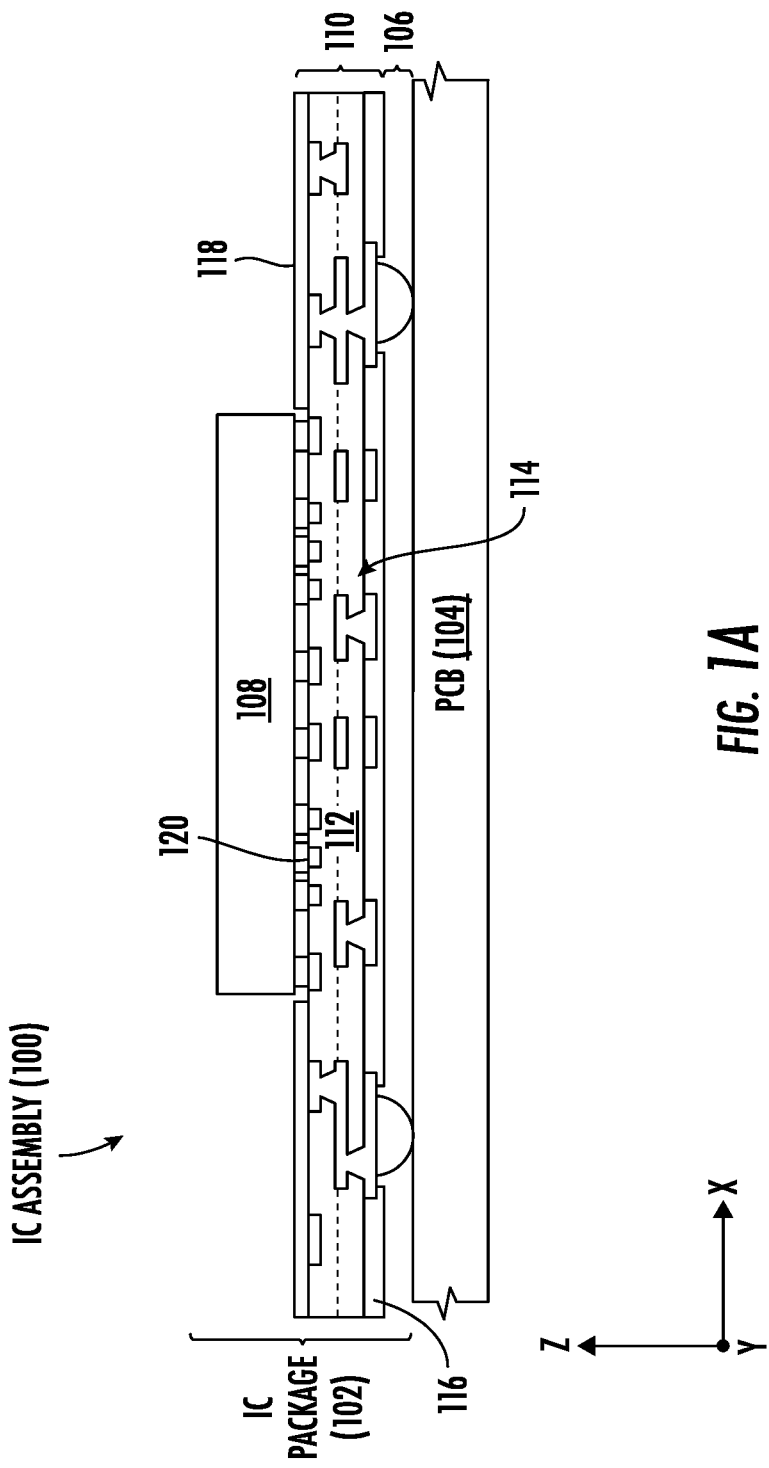
FIGS. 1A and 1B are side views of an exemplary integrated circuit (IC) package that includes a semiconductor die mounted on a package substrate in the form of an embedded trace substrate (ETS) to provide an electrical interface to the semiconductor die.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include integrated circuit (IC) package substrate with an embedded trace substrate (ETS) layer on a substrate. Related fabrication methods are also disclosed. The substrate can be a cored or coreless substrate. In exemplary aspects, a package substrate of the IC package includes an ETS layer disposed on the substrate to facilitate providing higher density ETS interconnects to provide bump/solder joints for coupling a semiconductor die (also referred to as "IC die" or "die") to the package substrate. The ETS layer is a coreless structure that includes metal traces embedded in a dielectric material for signal routing. Metal ETS interconnects are formed in the ETS layer that are coupled to the metal traces therein to provide ETS interconnects for bump/solder joints for coupling a semiconductor die to the package substrate. Providing the ETS interconnects for die connections in an ETS layer in the package substrate can facilitate the ETS interconnects having a reduced line-spacing ratio (L/S) (e.g., 5.0 micrometers (μm)/5.0 μm or less) over substrate interconnects in a substrate. This can be useful for high die interconnect density IC package applications, including without limitation split die IC packages that use upper layers of the substrate to form die-to-die connections. However, the reduced sized ETS interconnects in the ETS layer can be more easily "consumed" by die solder when coupled to a die, known as "metal consumption." Metal consumption can increase the risk of cracking the ETS layer, which if occurred, could reduce the quality and/or destroy interconnections between the package substrate and a semiconductor die(s). Thus, in additional exemplary aspects, raised metal pillar interconnects (e.g., metal posts, vertical interconnect accesses (vias)) are formed in contact with respective ETS interconnects of the ETS layer of the package substrate. The metal pillar interconnects are raised above an outer surface of the ETS layer so that the metal pillar interconnects are of an increased height and thus increased volume to reduce or avoid metal consumption. Thus, providing the raised metal pillar interconnects in an ETS layer disposed on a substrate in an IC package can reduce or avoid metal consumption and support ETS interconnects of a smaller L/S to support dies with higher connection density dies with reduced or avoided metal consumption.

In other exemplary aspects, the metal pillar interconnects coupled to the ETS layer are used as the structure to provide interconnection to the substrate interconnect interface of the package substrate to a die, because the ETS interconnects formed in the ETS layer are formed by a patterning process. This may make it easier to form the ETS interconnects to provide the ETS interconnects of a smaller L/S. The raised metal pillar interconnects can be formed by patterning a top or outer surface of the ETS layer to form openings above and through the thinner metal interconnects of the ETS layer to form the raised metal pillar interconnects. A metal material (e.g., copper) can be disposed in the openings to form the raised metal pillar interconnects as vias as an example, with a raised metal interconnect portion as one body coupled to the thinner ETS interconnects disposed below. This forms an electrical connection between the metal pillar interconnects and ETS interconnects in the ETS layer and to substrate interconnects in the package substrate.

Before discussing examples of integrated circuit (IC) package substrates with an embedded trace substrate (ETS) layer on a substrate for facilitating higher density die interconnections to one or more dies coupled to the package substrate starting at FIG. 2A, an IC package that employs a coreless substrate in the form of an ETS is first described in FIGS. 1A and 1B below.

In this regard, FIG. 1A illustrates a schematic view of a cross-section of an IC assembly 100 that includes an IC package 102 that is mounted to a printed circuit board (PCB) 104 using solder interconnects 106, such as solder balls. The IC package 102 includes a semiconductor die 108 (also referred to as "IC die 108" or "die 108") that is mounted to a package substrate 110 via a die-to-die bonding and/or underfill adhesive. The solder interconnects 106 are coupled to metal interconnections in the package substrate 110 to provide an electrical interface to the die 108 when the IC package 102 is mounted to the PCB 104. The package substrate 110 is a coreless substrate and may be an ETS. The package substrate 110 in the form of an ETS has the benefit of supporting fabrication of smaller line-spacing ratio (L/S) interconnections for higher density. The package substrate 110 includes a plurality of dielectric layers 112 that include embedded metal interconnects 114 (e.g., copper metal traces). The package substrate 110, being a coreless substrate, may employ a dielectric material in the dielectric layers 112 to reduce or avoid warpage and damage. Each of the dielectric layers 112 includes a patterned metal layer and vias to provide the metal interconnects 114. The package substrate 110 includes a first solder resist layer 116 and a second solder resist layer 118. Solder interconnects 106 are formed in openings in the first solder resist layer 116 coupled to the metal interconnects 114. A plurality of solder interconnects 120 is formed in the second solder resist layer 118 coupled to the metal interconnects 114 to provide electrical signal routing to the die 108. In this manner, the package substrate 110 facilitates electrical signal routing between the solder interconnects 106 and the die 108.

Figure 1B:
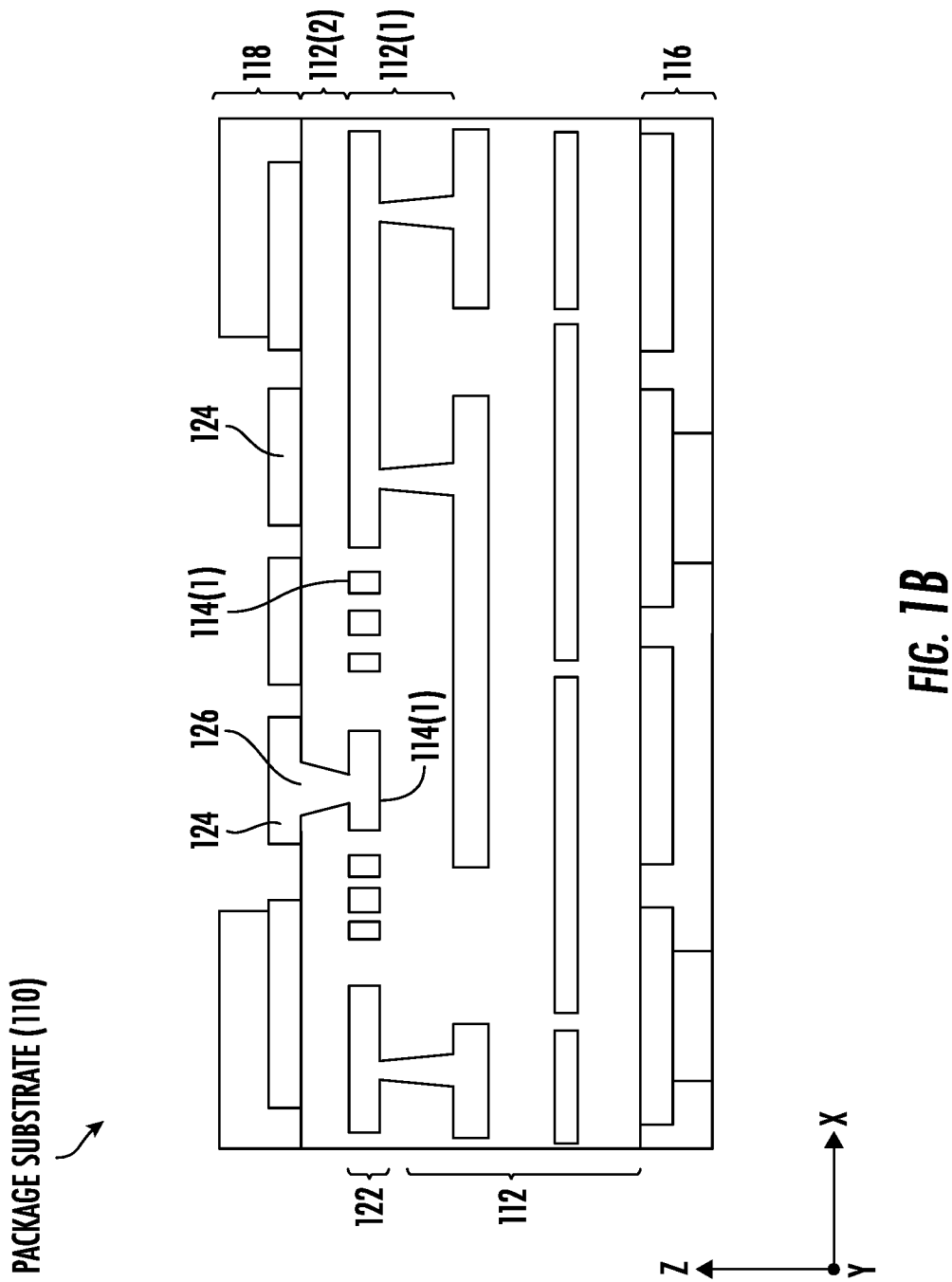

FIG. 1B illustrates a side view of the package substrate 110 in more detail. The package substrate 110 includes a substrate interconnect layer 122 in a dielectric layer 112(1) that includes metal interconnects 114(1) of a smaller L/S (e.g., 5.0/5.0) in the substrate interconnect layer 122 than other metal interconnects 114 in other dielectric layers 112. The smaller metal interconnects 114(1) can support higher density connections to the die 108 in FIG. 1A. However, the thickness of the metal interconnects 114(1) in the Z-axis direction in the substrate interconnect layer 122 is small. If the solder interconnects 120 were disposed directly on these metal interconnects 114(1), the solder interconnects 120 may "consume" these metal interconnects 114(1). For example, if the metal interconnects 114(1) are made of copper, the solder interconnects 120 disposed directly on these metal interconnects 114(1) can cause "copper consumption." It is desired to reduce metal interconnect consumption of the metal interconnects 114(1) in the substrate interconnect layer 122 of the package substrate 110 to decrease the risk of cracking the substrate interconnect layer 122 and reducing the quality and/or destroying interconnections to the die 108 in FIG. 1A.

To reduce metal interconnect consumption of the metal interconnects 114(1) in the substrate interconnect layer 122 of the package substrate 110 in FIG. 1B, an additional dielectric layer 112(2) is formed adjacent to or on top of the dielectric layer 112(1) in the Z-axis direction to form additional, larger substrate interconnects 124. Larger substrate interconnects 124 reduce metal interconnect consumption. Die connections on the die 108 in FIG. 1A connect to the larger substrate interconnects 124 when the die 108 is mounted on the package substrate 110. To form the larger substrate interconnects 124, openings are formed in the additional dielectric layer 112(2) to form vias 126 and larger substrate interconnects 124 as shown in FIG. 1B. The vias 126 connect the metal interconnects 114(1) and the larger substrate interconnects 124. Forming the additional dielectric layer 112(2) increases the cost of fabricating the package substrate 110. Also, forming the larger substrate interconnects 124 for the die 108 provides a design limitation to the IC package 102 in terms of how many interconnections can be made to the die 108. For example, the drilling of the openings in the additional dielectric layer 112(2) can cause the larger substrate interconnects 124 to have a US that is ten (10) times larger or more than the US of the metal interconnects 114(1). Also, if the IC package 102 includes multiple dies that are interconnected to each other through the package substrate 110, the larger substrate interconnects 124 provide a design limitation to the IC package 102 in terms of how many die-to-die interconnections can be made.

Figure 2A:
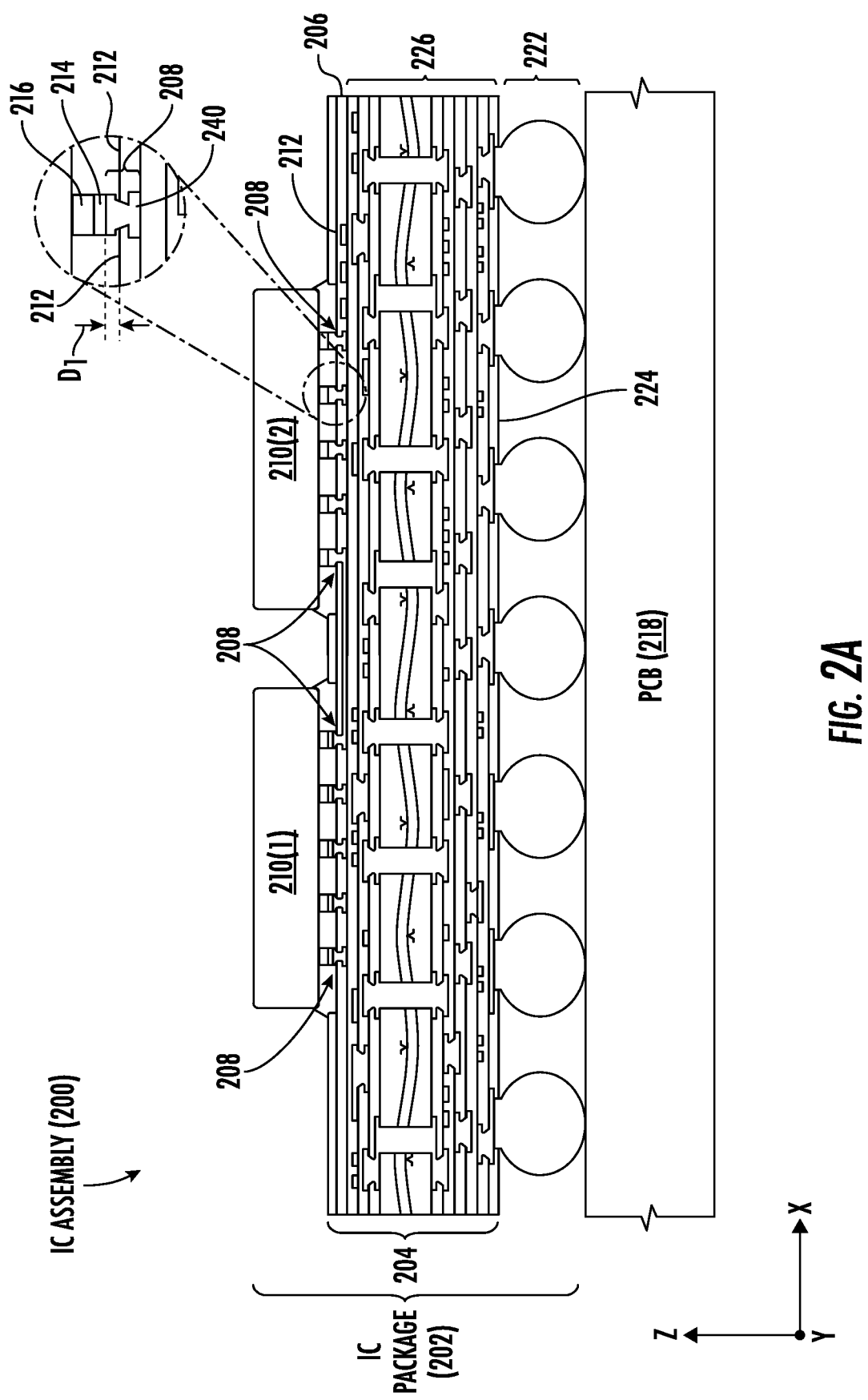
FIG. 2A is a side view of an exemplary IC assembly that includes an IC package with a package substrate that includes an embedded trace substrate (ETS) layer on a cored package substrate, wherein the ETS layer includes raised metal pillar interconnects for facilitating interconnections to one or more semiconductor dies ("IC dies" or "dies") coupled to the package substrate.

FIG. 2A is a side view of an exemplary IC assembly 200 that includes an IC package 202 employing a package substrate 204 that includes an ETS layer 206 on a substrate 226. In this example, the substrate 226 is a cored substrate and is referred to below as a "cored substrate 226." As will be discussed in more detail below, the package substrate 204 includes the ETS layer 206 to facilitate providing higher density interconnects to provide bump/solder joints for coupling the semiconductor dies 210(1), 210(2) (also referred to as "IC die" or "die") to the package substrate 204. The ETS layer 206 is a coreless structure that includes metal traces embedded in a dielectric material for signal routing. ETS interconnects, which are metal interconnects (e.g., metal traces, metal lines, metal post, metal pillars, vertical interconnect accesses (vias)) are formed in the ETS layer 206 that are coupled to the metal traces therein to provide ETS interconnects 246 (i.e., interconnects for connection to a substrate) for bump/solder joints for coupling the dies 210(1), 210(2) to the package substrate 204. Providing the ETS interconnects 246 for die connections in an ETS layer 206 can facilitate the ETS interconnects 246 having a reduced line-spacing ratio (L/S) (e.g., 5.0 micrometers (μm)/ 5.0 μm or less) over interconnects in a cored substrate. This can be useful for high die interconnect density IC package applications, including without limitation split die IC packages that use upper layers of the package substrate to form die-to-die connections.

However, the reduced sized ETS interconnects 246 in the ETS layer 206 can be more easily "consumed" by die solder when coupled to the dies 210(1), 210(1), known as "metal consumption." Metal consumption can increase the risk of cracking the ETS layer 206, which if occurred, could reduce the quality and/or destroy interconnections between the package substrate 204 and dies 210(1), 210(2). Thus, as shown in FIG. 2A, in this example, metal pillar interconnects 208 (e.g., metal posts, vertical interconnect accesses (vias)) are provided that are coupled to ETS interconnects 246 and are raised and extend above the outer surface 212 of the ETS layer 206 to provide a desired thickness $D_1$ to reduce or avoid solder die interconnects 214 used to connect die interconnects 216 to the ETS layer 206. Thus, solder die interconnects 214 are less likely to consume the metal pillar interconnects 208, referred to as "metal consumption." Reducing or avoiding metal consumption of the metal pillar interconnects 208 can decrease the risk of cracking the ETS layer 206, which if occurred, could reduce the quality and/or destroy interconnections between the package substrate 204 and the dies 210(1), 210(2). Providing the raised metal pillar interconnects 208 in the ETS layer 206 may also allow the ETS interconnects 246 to be formed with a reduced L/S than substrate pads formed in coreless structures that are not raised, because a greater line (L) size may be required in such substrate pads to reduce or avoid metal consumption by the solder die interconnects 214. Thus, providing the raised metal pillar interconnects 208 in the ETS layer 206 of the IC package 202 can reduce or avoid metal consumption and with a smaller L/S to support dies 210(1), 210(2) with higher connection density dies with smaller L/S die interconnects 216.

Figure 2B:
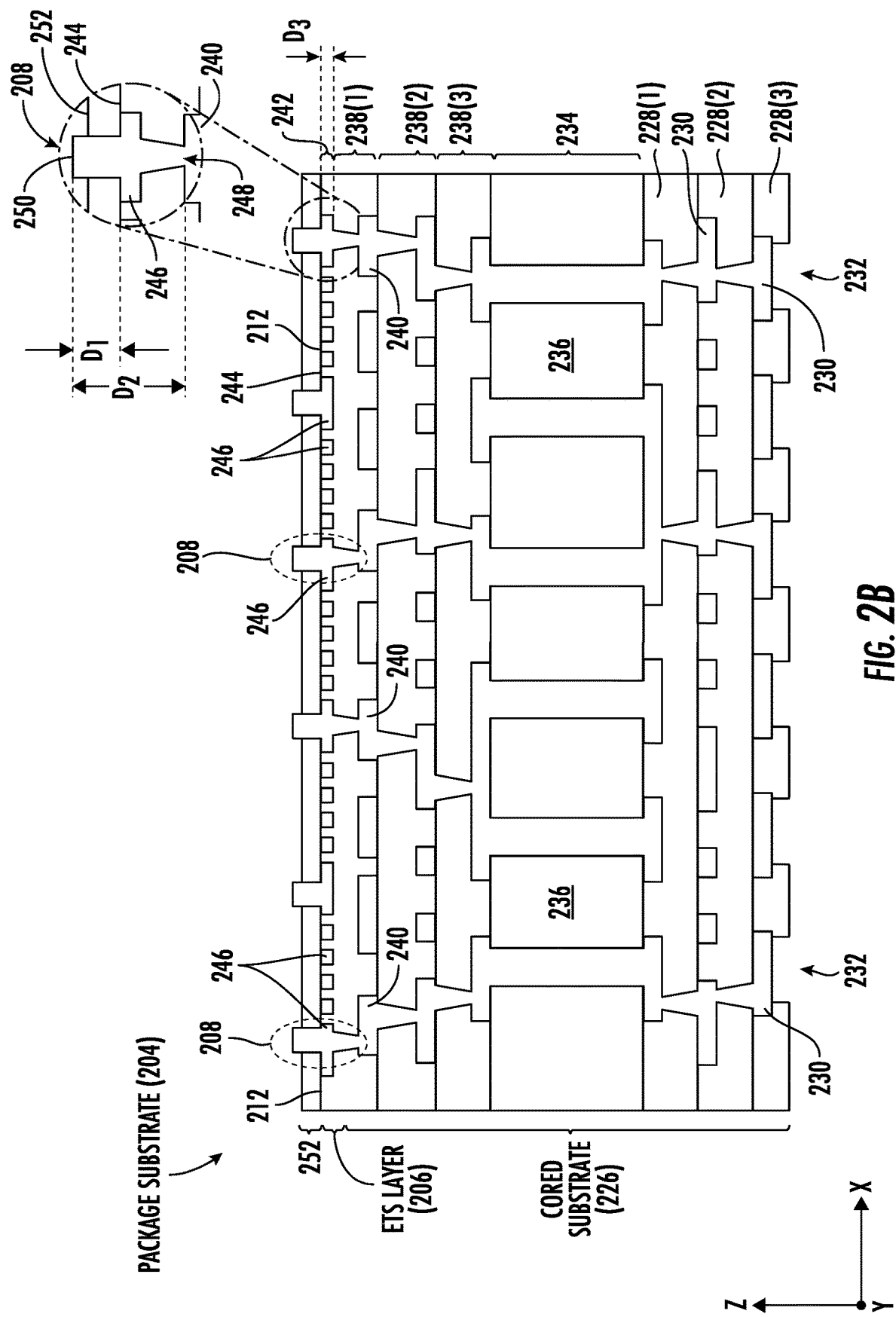
FIG. 2B is a side view of the package substrate in FIG. 2A.

FIG. 2B is a side view illustrating more exemplary detail of the package substrate 204 in FIG. 2A. Before discussing FIG. 2B regarding more detail about the raised metal pillar interconnects 208 in the ETS layer 206, the IC package 202 in FIG. 2A is first further described below.

With reference to FIG. 2A, the IC package 202 is mounted on a PCB 218 to form the IC assembly 200. To provide more rigidity to the package substrate 204 to reduce or avoid warpage, the package substrate 204 includes the cored substrate 226. Solder interconnects 222 (e.g., solder balls) are formed on a first, bottom surface 224 of the cored substrate 226 to provide electrical connections between the PCB 218 and the IC package 202. A cored substrate, such as the cored substrate 226, is a substrate that includes a core region that is typically thicker and is made from a dielectric material that is stiff to prevent or reduce warpage. The cored substrate 226 is disposed below ETS layer 206 in the Z-axis direction in FIG. 2A. The ETS layer 206 is mounted on the cored substrate 226. The cored substrate 226 and the ETS layer 206 include metal interconnections to provide electrical signal routing from the solder interconnects 222 to the dies 210(1), 210(2).

Additional exemplary detail of the package substrate 204 in the IC package 202 in FIG. 2A is shown in a side view of the package substrate 204 in FIG. 2B. With reference to FIG. 2B, the cored substrate 226 includes one or more substrate metallization layers 228(1)-228(3) below a cored region 234 in the Z-axis direction that each include one or more metal substrate interconnects 230 (e.g., e.g., metal traces, metal lines, metal post, metal pillars, vertical interconnect accesses (vias)) for providing electrical signal routing. The bottom substrate metallization layer 228(3) includes openings 232 to form the solder interconnects 222 in FIG. 2A in connection with the metal substrate interconnects 230 in the bottom substrate metallization layer 228(3). The cored substrate 226 also includes a cored region 234 that includes metal pillars 236 to provide electrical signal routing through the cored substrate 226. The metal pillars 236 are coupled to the metal substrate interconnects 230 in the substrate metallization layers 228(1)-228(3) to provide electrical signal routing from the solder interconnects 222 in FIG. 2A to the cored substrate 226. The cored substrate 226 also includes substrate metallization layers 238(1)-238(3) disposed above the cored region 234 in the Z-axis direction in FIG. 2B that each include one or more substrate metal interconnects 240 to provide electrical signal routing through the cored substrate 226. The substrate metal interconnects 240 are coupled to the metal pillars 236 in the cored substrate 226 to provide electrical signal routing from the solder interconnects 222 as shown in FIG. 2A.

The substrate metal interconnects 240 in an upper substrate metallization layer 238(1) of the cored substrate 226 may have a larger small L/S (e.g., 5.0/5.0 or higher) for supporting de die interconnections to the dies 210(1), 210(2). Thus, the substrate metal interconnects 240 of the cored substrate 226 may not support connections to high die interconnect density dies 210(1), 210(2) and/or high density bridge layers for die-to-die connections between the dies 210(1), 210(2). In this regard, with reference to FIG. 2B, the package substrate 204 includes the ETS layer 206 that includes an ETS interconnect layer 242 that is disposed adjacent to the substrate metallization layer 238(1) in the cored substrate 226 for forming ETS interconnects 246 to provide connections to the dies 210(1), 210(2) in FIG. 2A. The ETS interconnect layer 242 has an ETS interconnect layer outer surface 244 and includes one or more ETS interconnects 246 which are metal interconnects formed in the ETS interconnect layer 242 adjacent to the ETS interconnect layer outer surface 244. Metal pillar interconnects 208 extend through and are coupled to a respective ETS interconnect 246 of the ETS layer 206 and a substrate metal interconnect 240 in substrate metallization layer 238(1) of the cored substrate 226. The metal pillar interconnects 208 each include a first, bottom surface 248 that is coupled to the substrate metal interconnect 240 in the substrate metallization layer 238(1) of the cored substrate 226. The metal pillar interconnects 208 each include a second, top surface 250 that extends the distance $D_1$ above the ETS interconnect layer outer surface 244 and through a solder resist layer 252 in this example. The metal pillar interconnects 208 could be formed to only extend through the solder resist layer 252 or also the ETS interconnect layer outer surface 244 in addition to the solder resist layer 252. In this example, the metal pillar interconnects 208 are exposed from the solder resist layer 252 so that the other components in the substrate metallization layer 238(1) of the cored substrate 226 are protected by the solder resist layer 252. In this manner, the ETS interconnect layer 242 facilitates the formation of the metal pillar interconnects 208 that have an increased thickness or height according to distance $D_1$ above the ETS interconnect layer outer surface 244 for increased volume to provide substrate interconnections to the dies 210(1), 210(2) while reducing or avoiding metal consumption. Because the ETS interconnect layer 242 is provided in the ETS layer 206, the same patterning methods that are used to pattern metal lines in a ETS can be used to further pattern the ETS interconnect layer 242 to form the metal pillar interconnects 208.

In the example package substrate 204 in FIG. 2B, the metal pillar interconnect 208 has a total thickness or height of distance $D_2$, which is the distance from its second, top surface 250 to its first, bottom surface 248 in the height or Z-axis direction. The height distance $D_2$ of the metal pillar interconnect 208 may be equal to or greater than thirteen (13) micrometers (μm), as an example. The height distance $D_1$ of the metal pillar interconnect 208 extending above the ETS interconnect layer outer surface 244 may be equal to or greater than five (5) μm, as an example. The ETS interconnect layer 242 has a height distance $D_3$ in the height or Z-axis direction, which may be 7 μm, as an example. As another example, a ratio of the height distance $D_2$ of the metal pillar interconnect 208 to the height distance $D_3$ of the ETS interconnect layer 242 may be at least 1.4. As another example, providing the increased height distance $D_1$ of the metal pillar interconnect 208 extending above the ETS interconnect layer outer surface 244 to reduce or avoid metal consumption may allow the L/S of the metal pillar interconnect 208 to be 4.0/4.0 or less to provide a sufficiently small and dense L/S to support interconnects to the dies 210(1), 210(2) having a high density of die interconnects. As other examples, the L/S of the metal pillar interconnects 208 may be 3.0/3.0 or 2.0/2.0.

Note with respect to FIGS. 2A and 2B, that the upper substrate metallization layer 238(1) (or other metallization layers) in the cored substrate 226 can also serve as a bridge layer to provide die-to-die (D2D) connections between the dies 210(1), 210(2). In this regard, in one example, substrate metal interconnects 240 in the upper substrate metallization layer 238(1) that are coupled to the die 210(1) through a respective ETS interconnect 246 and coupled metal pillar interconnect 208 can be coupled to other substrate metal interconnects 240 in the upper substrate metallization layer 238(1) that are coupled to the die 210(2) to provide a D2D connection between the dies 210(1), 210(2). In this manner, the ETS layer 206 with its ETS interconnects 246 provided at a smaller L/S can support higher density die interconnections between the die 210(1), 210(2) for D2D connections. This may avoid having to expand a bridge for D2D connections into lower metallization layers in the cored substrate 226 that could other be used for other signal routing.

Figure 3:
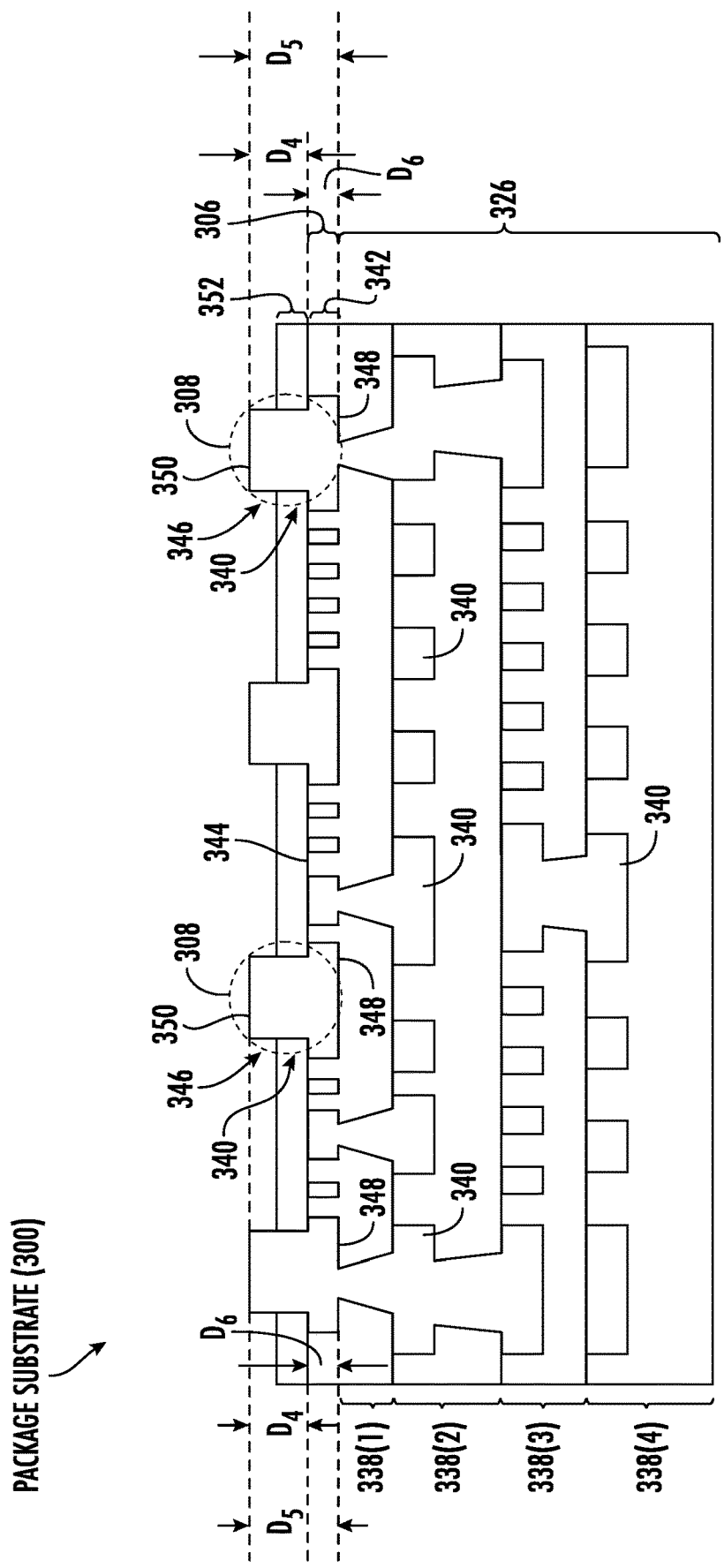
FIG. 3 is a side view of another exemplary package substrate for an IC package that includes an ETS layer on a coreless substrate, wherein the ETS layer includes raised metal pillar interconnects for facilitating interconnections to one or more dies coupled to the package substrate.

FIG. 3 is a side view of another exemplary package substrate 300 for an IC package that includes a ETS layer 306 coupled on a coreless substrate 326 as opposed to a cored substrate, like the cored substrate 226 in FIGS. 2A and 2B. The ETS layer 306 includes raised metal pillar interconnects 308 for facilitating interconnections to one or more dies coupled to the ETS layer 306. For example, an IC package that includes the package substrate 300 in FIG. 3 may not need to include a cored substrate to avoid warpage. For example, for smaller device applications, such as mobile devices, the coreless substrate 326 may support the necessary metal interconnects for signal routing without the need for a cored substrate.

In this regard, with reference to FIG. 3, the coreless substrate 326 includes substrate metallization layers 338(1)-338(4) that each include one or more substrate metal interconnects 340 for providing electrical signal routing through the coreless substrate 326. The coreless substrate 326 may be an ETS. The substrate metal interconnects 340 may have a sufficiently small L/S (e.g., 4.0/4.0 or lower) to support a high density of die interconnections to a die. However, the thickness of the substrate metal interconnects 340 may be small enough such that metal consumption can occur if solder interconnects were disposed directly in contact with the substrate metal interconnects 340 to form die connections to a die and the coreless substrate 326. In this regard, the ETS layer 306 is additionally provided in the package substrate 300 and includes an ETS interconnect layer 342 that is disposed adjacent to the substrate metallization layer 338(1) for forming metal interconnects to provide connections to a die. The ETS interconnect layer 342 has an ETS interconnect layer outer surface 344 and includes one or more ETS interconnects 346 which are metal interconnects formed in the ETS interconnect layer 342 adjacent to the ETS interconnect layer outer surface 344. Metal pillar interconnects 308 extend through and are coupled to a respective ETS interconnect 346 and substrate metal interconnect 340 in substrate metallization layer 338(1). The metal pillar interconnects 308 each include a first, bottom surface 348 that is coupled to a substrate metal interconnect 340 in the substrate metallization layer 338(1). The metal pillar interconnects 308 each include a second, top surface 350 that extends a height distance $D_4$ above the ETS interconnect layer outer surface 344 and through a solder resist layer 352. In this manner, the ETS interconnect layer 342 facilitates the formation of the metal pillar interconnects 308 that have an increased thickness or height according to the distance $D_4$ above the ETS interconnect layer outer surface 344 to provide substrate interconnections to a die while reducing or avoiding metal consumption. Because the ETS interconnect layer 342 is provided in the ETS layer 306, the same patterning methods that are used to pattern metal lines in a coreless substrate can be used to further pattern the ETS interconnect layer 342 to form the metal pillar interconnects 308.

In the example ETS layer 306 in FIG. 3, the metal pillar interconnect 308 has a total thickness $D_5$, which is the distance from its second, top surface 350 to its first, bottom surface 348 in the height or Z-axis direction. The thickness distance $D_5$ of the metal pillar interconnect 308 may be equal to or greater than ten (10) micrometers (μm) as an example. The thickness distance $D_4$ of the metal pillar interconnect 308 extending above the ETS interconnect layer outer surface 344 may be equal to or greater than five (5) μm as an example. The ETS interconnect layer 342 has a thickness distance $D_6$ in the height or Z-axis direction, which may be seven (7) μm as an example. As another example, a ratio of the thickness distance $D_5$ of the metal pillar interconnect 308 to a thickness $D_6$ of the ETS interconnect layer 342 may be at least 1.4. As another example, providing the increased thickness distance $D_4$ of the metal pillar interconnect 308 extending above the ETS interconnect layer outer surface 344 to reduce or avoid metal consumption may allow the US of the metal pillar interconnect 308 to be 4.0/4.0 to provide a sufficiently dense US to support interconnects to a die having a high density of die interconnects. As other examples, the US of the metal pillar interconnects 308 may be 3.0/3.0 or 2.0/2.0.

Figure 4:
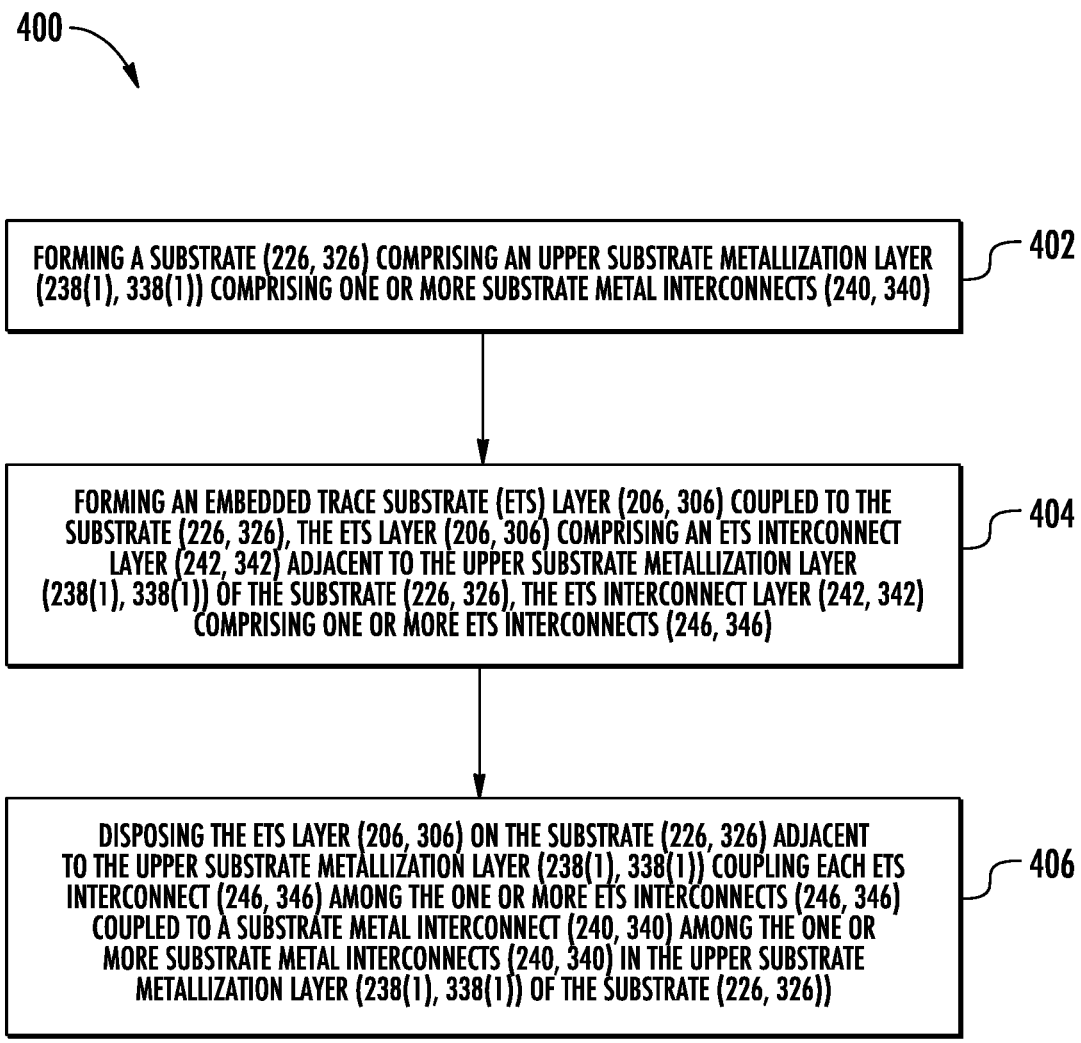
FIG. 4 is a flowchart illustrating an exemplary process of fabricating an IC package that includes an ETS layer on a substrate, wherein the ETS layer includes raised metal pillar interconnects for facilitating interconnections to one or more dies coupled to the package substrate, such as the package substrates in FIGS. 2A-2B and 3.

FIG. 4 is a flowchart illustrating an exemplary process 400 of fabricating a package substrate that includes an ETS layer on a substrate for facilitating higher density die interconnections to one or more dies. The process 400 is described in reference to the package substrates 204, 300 in FIGS. 2A-2B and 3. As discussed below, additionally providing the ETS layer on a substrate (e.g., a cored substrate or coreless substrate) in a package substrate can facilitate an enhanced process to form smaller US metal pillar interconnects for providing die connections.

In this regard, the process 400 includes forming a substrate 226, 326 comprising an upper substrate metallization layer 238(1), 338(1) comprising one or more substrate metal interconnects 240, 340 (block 402 in FIG. 4). The process 400 also includes forming an ETS layer 206, 306 coupled to the substrate 226, 326, the ETS layer 206, 306 comprising an ETS interconnect layer 242, 342 adjacent to the upper substrate metallization layer 238(1), 338(1) of the substrate 226, 326, the ETS interconnect layer 242, 342 comprising one or more ETS interconnects 246, 346 (block 404 in FIG. 4). The process 400 also includes disposing the ETS layer 206, 306 on the substrate 226, 326 adjacent to the upper substrate metallization layer 238(1), 338(1) coupling each ETS interconnect 246, 346 among the one or more ETS interconnects 246, 346 coupled to a substrate metal interconnect 240, 340 among the one or more substrate metal interconnects 240, 340 in the upper substrate metallization layer 238(1), 338(1) of the substrate 226, 326 (block 406 in FIG. 4).

FIGS. 5A-5D illustrate exemplary fabrication stages during fabrication of the package substrate 204 in FIGS. 2A and 2B that includes the cored substrate 226 and ETS layer 206 that includes raised metal pillar interconnects 208 for facilitating interconnections to the dies 210(1), 210(2). FIGS. 6A and 6B area flowchart illustrating an exemplary process 600 of fabricating the package substrate in 204 FIGS. 2A and 2B according to the exemplary fabrication stages in FIGS. 5A-5D. The fabrication stages in FIGS. 5A-5D of fabricating of the package substrate 204 in FIGS. 2A and 2B according to the process 600 in FIGS. 6A and 6B will be described together below. Note that the fabrication process 600 can also be employed to fabricate the package substrate 300 in FIG. 3.

In this regard, FIG. 5A illustrates a first fabrication stage 500A of fabricating the package substrate 204 in FIGS. 2A and 2B. As shown in FIG. 5A, the ETS layer 206 and cored substrate 226 are formed (block 602 in FIG. 6A). The ETS layer 206 is fabricated on a carrier structure 502 so that the ETS layer 206 can be processed independent of the cored substrate 226 so as to form the ETS interconnects 246 of a smaller L/S spacing. A dielectric laminate 504 is provided to support laminating the ETS layer 206 onto the cored substrate 226 to form a package substrate. A next step in the fabrication process 600 is shown in the fabrication stage 500B in FIG. 5B. In this fabrication stage 500B, the ETS layer 206 is bonded to the cored substrate 226 by laminating the ETS layer 206 onto the cored substrate 226 using the dielectric laminate 504 as a lamination layer (block 604 in FIG. 6A). The ETS layer 206 is aligned with the cored substrate 226 to achieve the desired couplings between the ETS interconnects 246 in the ETS layer 206 and the substrate metal interconnects 240 in the upper substrate metallization layer 238(1) of the cored substrate 226. The carrier structure 502 is then removed from the ETS layer 206.

Figure 7:
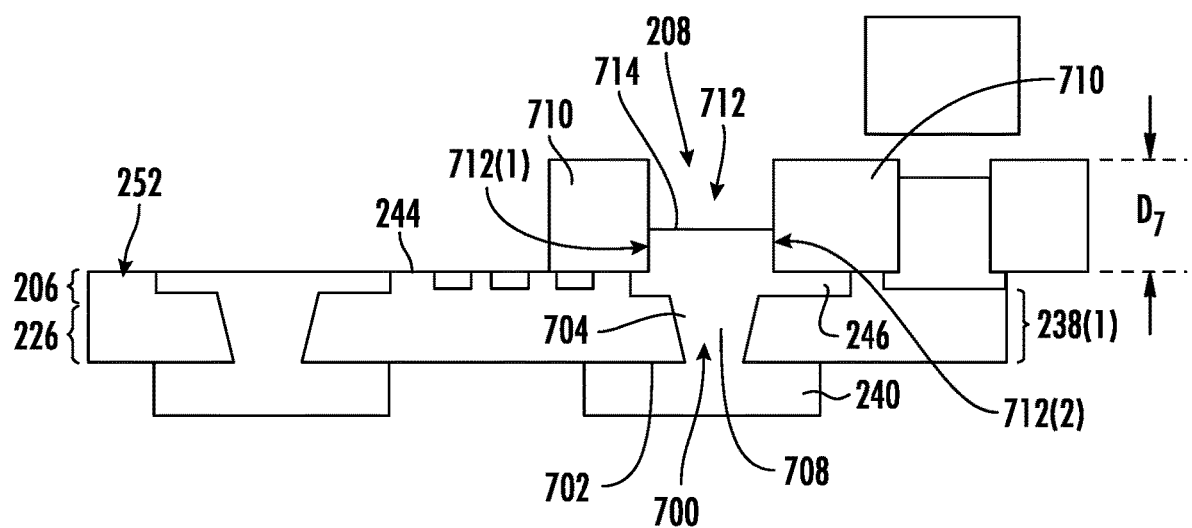
FIG. 7 is a schematic diagram of an exemplary process of fabricating raised metal pillar interconnects in an ETS layer that is coupled to a substrate.

A next step in the fabrication process 600 is shown in the fabrication stage 500C in FIG. 5C. In this fabrication stage 500C, the ETS layer 206 is processed to form the metal pillar interconnects 208 coupled to the ETS interconnects 246 formed in the ETS layer 206 (block 606 in FIG. 6B). This is shown in more detail in FIG. 7. A solder resist layer 252 is disposed on the ETS interconnect layer outer surface 244 and the metal pillar interconnect 208 to protect any components of the cored substrate 226 that should not be exposed to solder when the dies 210(1), 210(2) are coupled to the ETS layer 206. A first opening 700 is etched (e.g., such as by a green laser (e.g., a $CO_2$ laser) or ultraviolet (UV) laser (e.g., a YAG laser)) through the ETS layer 206 and the ETS interconnect 246 down to a top surface 702 of the substrate metal interconnect 240 in the substrate metallization layer 238(1) of the cored substrate 226. A metal material 704 is disposed in the first opening 700 to form a via 708 of the metal pillar interconnect 208 coupled to the ETS interconnect 246, which is coupled to the substrate metal interconnect 240. Posts 710 are formed on each side 712(1), 712(2) of the first opening 700 to form a second opening 712 above the first opening 700. The posts 710 are disposed a distance $D_7$ above the ETS interconnect layer outer surface 244. A second metal material 714 is disposed in the second opening 712 and coupled to the via 708 to form the metal pillar interconnect 208. In this example, the metal pillar interconnect 208 is formed by the via 708 and the second metal material 714 disposed in the second opening 712 to become a single body metal pillar. Alternatively, the first and second openings 700, 712 could be formed first before disposing a metal material in the first and second openings 700, 712 to form the metal pillar interconnect 208 in one disposition step. Then, as shown in fabrication stage 500D in FIG. 5D, the solder resist layer 252 can be thinned down to the desired height to expose the metal pillar interconnects 208 to the desired height above the ETS interconnect layer outer surface 244 in the Z-axis direction to prepare the dies 210(1), 210(2) to be coupled to the metal pillar interconnects 208 (block 608 in FIG. 6B).

Note that the terms "top" and "bottom" where used herein are relative terms and are not meant to limit or imply a strict orientation that a "top" referenced element must always be oriented to be above a "bottom" referenced element, and vice versa. Also, note that the terms "above" and "below" where used herein are relative terms and are not meant to limit or imply a strict orientation that an element referenced as being "above" another referenced element must always be oriented to be above the other reference element with respect to ground, or that an element referenced as being "below" another referenced element must always be oriented to be below the other reference element with respect to ground.

IC packages employing a package substrate employing an ETS layer that includes raised metal pillar interconnects for facilitating interconnections to one or more IC dies coupled to a substrate, including, but not limited to, the package substrates in FIGS. 2A-2B and 3, and according to the fabrication processes in FIGS. 6A and 6B and FIGS. 5A-5D, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 8:
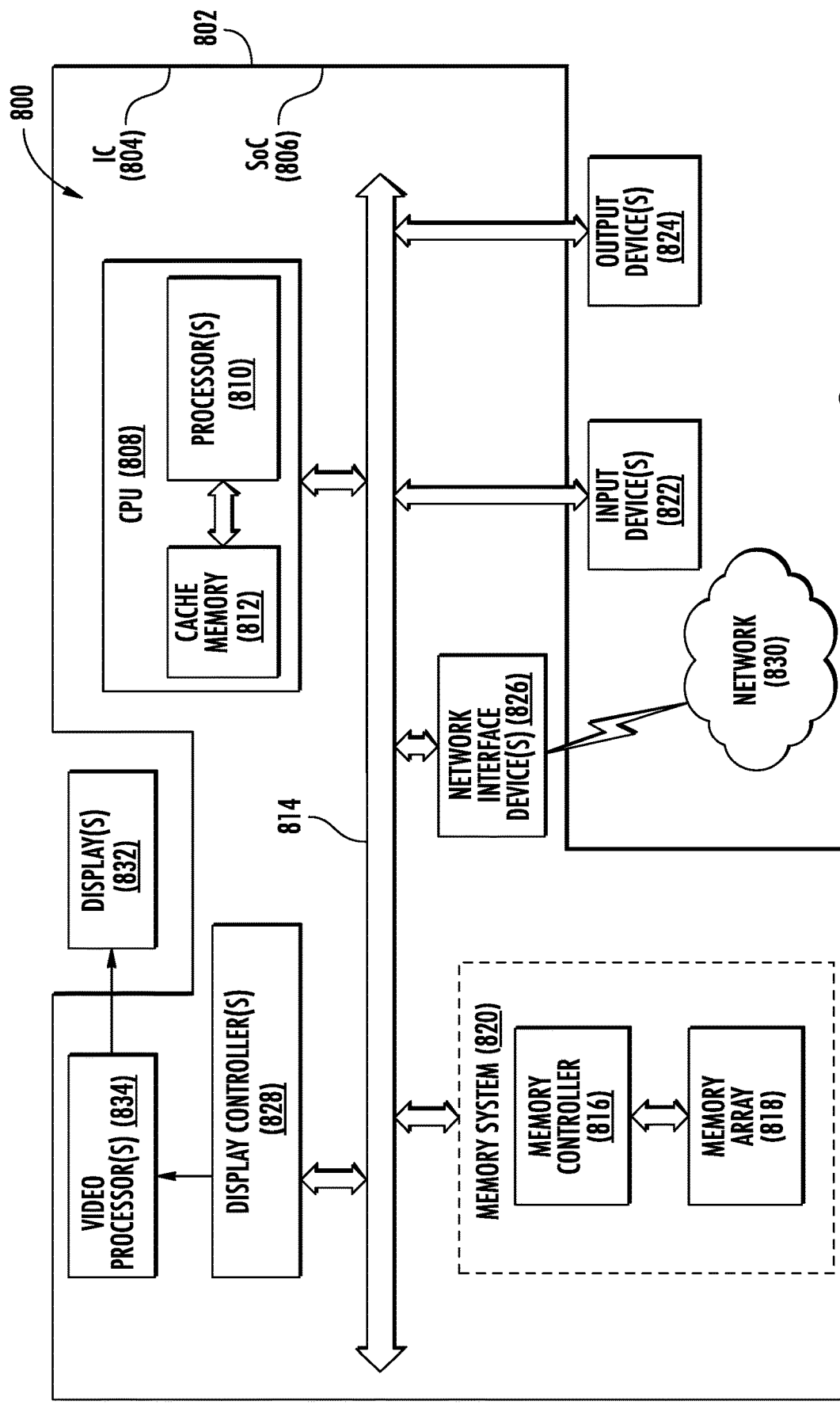
FIG. 8 is a block diagram of an exemplary processor-based system that can be provided in one or more IC packages employing a package substrate that includes an ETS layer on a package substrate, wherein the ETS layer includes raised metal pillar interconnects for facilitating interconnections to one or more dies coupled to the package substrate, including, but not limited to, the package substrates in FIGS. 2A-2B and 3, and according to the fabrication processes in FIGS. 5A-5D and 6A and 6B.

In this regard, FIG. 8 illustrates an example of a processor-based system 800 including a circuit that can be provided in an IC package 802 employing a package substrate that includes an ETS layer on a substrate, wherein the ETS layer includes raised metal pillar interconnects for facilitating interconnections to one or more IC dies coupled to the package substrate, including, but not limited to, the package substrates in FIGS. 2A-2B and 3, and according to the fabrication processes in FIGS. 6A and 6B and FIGS. 5A-5D, and according to any aspects disclosed herein. In this example, the processor-based system 800 may be formed as an IC 804 in an IC package 802 and as a system-on-a-chip (SoC) 806. The processor-based system 800 includes a central processing unit (CPU) 808 that includes one or more processors 810, which may also be referred to as CPU cores or processor cores. The CPU 808 may have cache memory 812 coupled to the CPU 808 for rapid access to temporarily stored data. The CPU 808 is coupled to a system bus 814 and can intercouple master and slave devices included in the processor-based system 800. As is well known, the CPU 808 communicates with these other devices by exchanging address, control, and data information over the system bus 814. For example, the CPU 808 can communicate bus transaction requests to a memory controller 816 as an example of a slave device. Although not illustrated in FIG. 8, multiple system buses 814 could be provided, wherein each system bus 814 constitutes a different fabric.

Other master and slave devices can be connected to the system bus 814. As illustrated in FIG. 8, these devices can include a memory system 820 that includes the memory controller 816 and a memory array(s) 818, one or more input devices 822, one or more output devices 824, one or more network interface devices 826, and one or more display controllers 828, as examples. Each of the memory system 820, the one or more input devices 822, the one or more output devices 824, the one or more network interface devices 826, and the one or more display controllers 828 can be provided in the same or different IC packages 802. The input device(s) 822 can include any type of input device, including, but not limited to, input keys, switches, voice processors, etc. The output device(s) 824 can include any type of output device, including, but not limited to, audio, video, other visual indicators, etc. The network interface device(s) 826 can be any device configured to allow exchange of data to and from a network 830. The network 830 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 826 can be configured to support any type of communications protocol desired.

The CPU 808 may also be configured to access the display controller(s) 828 over the system bus 814 to control information sent to one or more displays 832. The display controller(s) 828 sends information to the display(s) 832 to be displayed via one or more video processors 834, which process the information to be displayed into a format suitable for the display(s) 832. The display controller(s) 828 and video processor(s) 834 can be included as ICs in the same or different IC packages 802, and in the same or different IC package 802 containing the CPU 808 as an example. The display(s) 832 can include any type of display, including, but not limited to, a cathode ray tube (CRT), a liquid crystal display (LCD), a plasma display, a light emitting diode (LED) display, etc.

Figure 9:
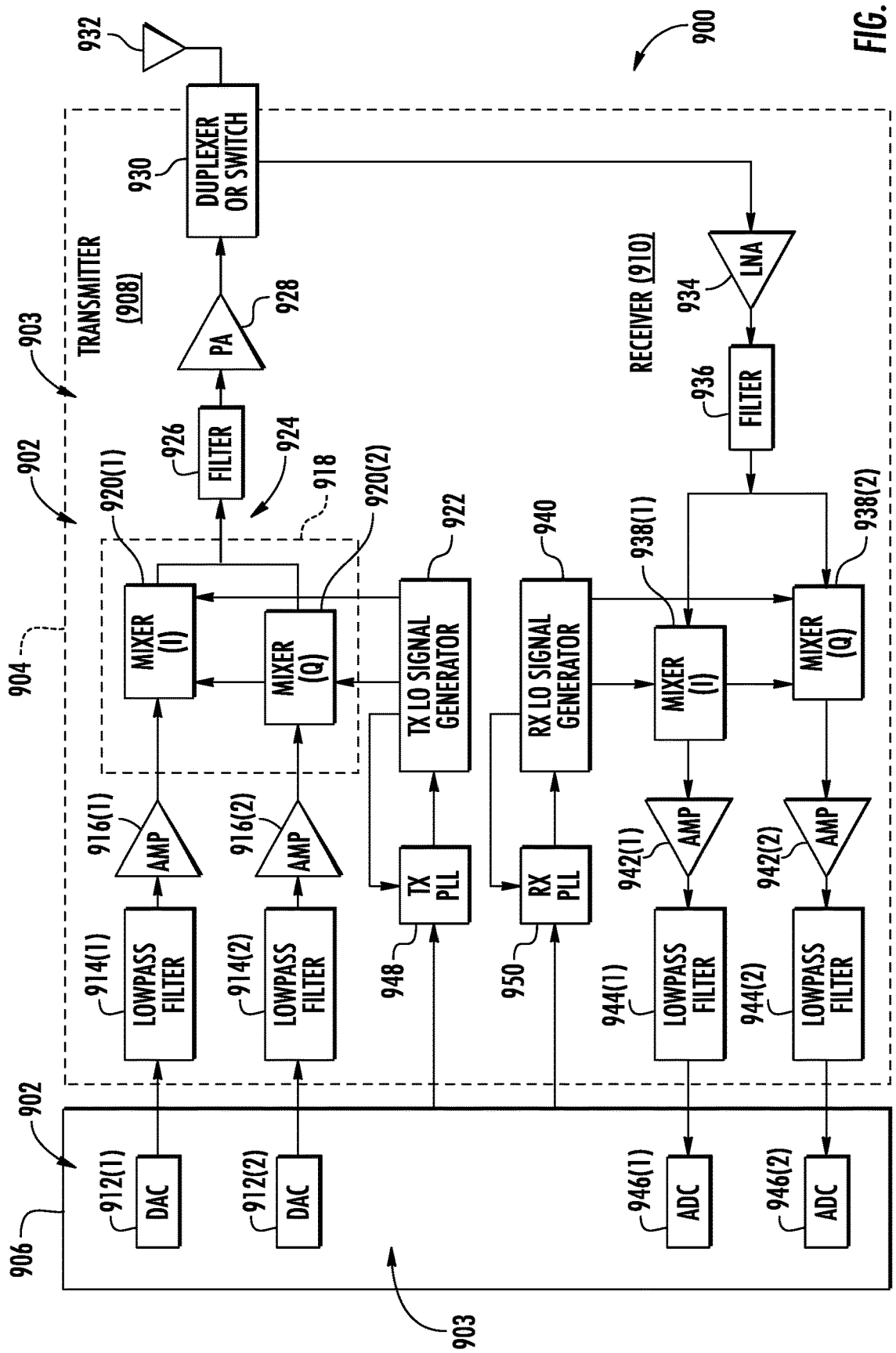
FIG. 9 is a block diagram of an exemplary wireless communications device that includes radio frequency (RF) components provided in one or more IC packages employing a package substrate that includes an ETS layer on a substrate, wherein the ETS layer includes raised metal pillar interconnects for facilitating interconnections to one or more dies coupled to the package substrate, including, but not limited to, the package substrates in FIGS. 2A-2B and 3, and according to the fabrication processes in FIGS. 5A-5D and 6A and 6B.

FIG. 9 illustrates an exemplary wireless communications device 900 that includes radio frequency (RF) components formed from one or more ICs 902, wherein any of the ICs 902 can be included in an IC package 903 employing a package substrate that includes an ETS layer on a substrate, wherein the ETS layer includes raised metal pillar interconnects for facilitating interconnections to one or more IC dies coupled to the package substrate, including, but not limited to, the package substrates in FIGS. 2A-2B and 3, and according to the fabrication processes in FIGS. 6A and 6B and FIGS. 5A-5D, and according to any aspects disclosed herein. The wireless communications device 900 may include or be provided in any of the above-referenced devices, as examples. As shown in FIG. 9, the wireless communications device 900 includes a transceiver 904 and a data processor 906. The data processor 906 may include a memory to store data and program codes. The transceiver 904 includes a transmitter 908 and a receiver 910 that support bi-directional communications. In general, the wireless communications device 900 may include any number of transmitters 908 and/or receivers 910 for any number of communication systems and frequency bands. All or a portion of the transceiver 904 may be implemented on one or more analog ICs, RF ICs (RFICs), mixed-signal ICs, etc.

The transmitter 908 or the receiver 910 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 910. In the direct-conversion architecture, a signal is frequency-converted between RF and baseband in one stage. The super-heterodyne and direct-conversion architectures may use different circuit blocks and/or have different requirements. In the wireless communications device 900 in FIG. 9, the transmitter 908 and the receiver 910 are implemented with the direct-conversion architecture.

In the transmit path, the data processor 906 processes data to be transmitted and provides I and Q analog output signals to the transmitter 908. In the exemplary wireless communications device 900, the data processor 906 includes digital-to-analog converters (DACs) 912(1), 912(2) for converting digital signals generated by the data processor 906 into the I and Q analog output signals, e.g., I and Q output currents, for further processing.

Within the transmitter 908, lowpass filters 914(1), 914(2) filter the I and Q analog output signals, respectively, to remove undesired signals caused by the prior digital-to-analog conversion. Amplifiers (AMPs) 916(1), 916(2) amplify the signals from the lowpass filters 914(1), 914(2), respectively, and provide I and Q baseband signals. An upconverter 918 upconverts the I and Q baseband signals with I and Q transmit (TX) local oscillator (LO) signals through mixers 920(1), 920(2) from a TX LO signal generator 922 to provide an upconverted signal 924. A filter 926 filters the upconverted signal 924 to remove undesired signals caused by the frequency up-conversion as well as noise in a receive frequency band. A power amplifier (PA) 928 amplifies the upconverted signal 924 from the filter 926 to obtain the desired output power level and provides a transmit RF signal. The transmit RF signal is routed through a duplexer or switch 930 and transmitted via an antenna 932.

In the receive path, the antenna 932 receives signals transmitted by base stations and provides a received RF signal, which is routed through the duplexer or switch 930 and provided to a low noise amplifier (LNA) 934. The duplexer or switch 930 is designed to operate with a specific receive (RX)-to-TX duplexer frequency separation, such that RX signals are isolated from TX signals. The received RF signal is amplified by the LNA 934 and filtered by a filter 936 to obtain a desired RF input signal. Down-conversion mixers 938(1), 938(2) mix the output of the filter 936 with I and Q RX LO signals (i.e., LO_I and LO_Q) from an RX LO signal generator 940 to generate I and Q baseband signals. The I and Q baseband signals are amplified by AMPs 942(1), 942(2) and further filtered by lowpass filters 944(1), 944(2) to obtain I and Q analog input signals, which are provided to the data processor 906. In this example, the data processor 906 includes analog-to-digital converters (ADCs) 946(1), 946(2) for converting the analog input signals into digital signals to be further processed by the data processor 906.

In the wireless communications device 900 of FIG. 9, the TX LO signal generator 922 generates the I and Q TX LO signals used for frequency up-conversion, while the RX LO signal generator 940 generates the I and Q RX LO signals used for frequency down-conversion. Each LO signal is a periodic signal with a particular fundamental frequency. A TX phase-locked loop (PLL) circuit 948 receives timing information from the data processor 906 and generates a control signal used to adjust the frequency and/or phase of the TX LO signals from the TX LO signal generator 922. Similarly, an RX PLL circuit 950 receives timing information from the data processor 906 and generates a control signal used to adjust the frequency and/or phase of the RX LO signals from the RX LO signal generator 940.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. A package substrate for an integrated circuit (IC) package, comprising:
   a substrate, comprising:
      an upper substrate metallization layer comprising one or more substrate metal interconnects; and
      an embedded trace substrate (ETS) layer coupled to the substrate, the ETS layer comprising:
      an ETS interconnect layer adjacent to the upper substrate metallization layer of the substrate, the ETS interconnect layer comprising one or more ETS interconnects;
   each ETS interconnect among the one or more ETS interconnects coupled to a substrate metal interconnect among the one or more substrate metal interconnects in the upper substrate metallization layer of the substrate.

2. The package substrate of clause 1, wherein the substrate comprises a cored substrate.

3. The package substrate of clause 1, wherein the substrate comprises a coreless substrate.

4. The package substrate of clause 1, wherein a line-spacing ratio (L/S) of each ETS interconnect among the one or more ETS interconnects is less than 5.0/5.0.

5. The package substrate of clause 1, further comprising one or more metal pillar interconnects each coupling an ETS interconnect among the one or more ETS interconnects, to a substrate metal interconnect among the one or more substrate metal interconnects.

6. The package substrate of clause 5, wherein:
the ETS interconnect layer comprises an ETS interconnect layer outer surface;
the one or more ETS interconnects are adjacent to the ETS interconnect layer outer surface; and
the one or more metal pillar interconnects each comprises a first surface extending a distance from the ETS interconnect layer outer surface.

7. The package substrate of clause 6, wherein the distance of a portion of the one or more metal pillar interconnects extending from the ETS interconnect layer outer surface is equal to or greater than five (5) micrometers ($\mu m$).

8. The package substrate of clause 6, wherein each of the one or more metal pillar interconnects extends through the one or more ETS interconnects and is coupled to the substrate metal interconnect among the one or more substrate metal interconnects in the upper substrate metallization layer of the substrate.

9. The package substrate of clause 6, wherein each of the one or more metal pillar interconnects comprises a second surface coupled to the substrate metal interconnect among the one or more substrate metal interconnects in the upper substrate metallization layer of the substrate.

10. The package substrate of clause 9, wherein each of the one or more metal pillar interconnects has a thickness of a second distance equal to or greater than ten (10) micrometers ($\mu m$) between the first surface each of the one or more metal pillar interconnects and the second surface of each of the one or more the metal pillar interconnect.

11. The package substrate of clause 6, wherein a ratio of a thickness of the one or more metal pillar interconnects to a thickness of the ETS interconnect layer is at least 1.4.

12. The package substrate of clause 6, wherein a line-spacing ratio (L/S) of the one or more metal pillar interconnects is less than 5.0/5.0.

13. The package substrate of clause 6, further comprising a solder resist layer comprising a second surface and a third surface coupled to the ETS layer, at least one of the one or more metal pillar interconnects further extending through the solder resist layer and further extending a second distance above the second surface of the solder resist layer.

14. The package substrate of clause 1, wherein:
the substrate further comprises at least one additional substrate metallization layer adjacent to the upper substrate metallization layer, wherein the upper substrate metallization layer is disposed between the ETS layer and the at least one additional substrate metallization layer; and
each of the at least one additional substrate metallization layer comprises one or more additional substrate metal interconnects; and
at least one of the one or more additional substrate metal interconnects are coupled to at least one of the one or more substrate metal interconnects in the upper substrate metallization layer.

15. An integrated circuit (IC) package, comprising:
a package substrate, comprising:
a substrate, comprising:
an upper substrate metallization layer comprising one or more substrate metal interconnects; and
an embedded trace substrate (ETS) layer coupled to the substrate, the ETS layer, comprising:
an ETS interconnect layer adjacent to the upper substrate metallization layer of the substrate, the ETS interconnect layer comprising one or more ETS interconnects;
each ETS interconnect among the one or more ETS interconnects coupled to a substrate metal interconnect among the one or more substrate metal interconnects in the upper substrate metallization layer of the substrate; and
a die coupled to at least one ETS interconnect among the one or more ETS interconnects in the ETS layer.

16. The IC package of clause 15, wherein:
the one or more ETS interconnects comprise a plurality of ETS interconnects;
a plurality of die interconnects coupled to the die; and
each die interconnect among the plurality of die interconnects is coupled to an ETS interconnect among the plurality of ETS interconnects.

17. The IC package of clause 15, further comprising one or more metal pillar interconnects each coupling an ETS interconnect among the one or more ETS interconnects, to a substrate metal interconnect among the one or more substrate metal interconnects.

18. The IC package of clause 17, wherein:
the ETS interconnect layer comprises an ETS interconnect layer outer surface;
the one or more ETS interconnects are adjacent to the ETS interconnect layer outer surface; and
the one or more metal pillar interconnects each comprises a first surface extending a distance from the ETS interconnect layer outer surface.

19. The IC package of clause 18, wherein each of the one or more metal pillar interconnects comprises a second surface coupled to the substrate metal interconnect among the one or more substrate metal interconnects in the upper substrate metallization layer of the substrate.

20. The IC package of clause 16, wherein:
the upper substrate metallization layer further comprises one or more second substrate metal interconnects; and
the ETS interconnect layer comprises one or more second ETS interconnects;
each second ETS interconnect among the one or more second ETS interconnects coupled to a second substrate metal interconnect among the one or more second substrate metal interconnects in the upper substrate metallization layer of the substrate; and
further comprising:
a second die;
a plurality of second die interconnects coupled to the second die;
each second die interconnect among the plurality of second die interconnects coupled to a second ETS interconnect among the one or more second ETS interconnects; and
at least one ETS interconnect among the one or more ETS interconnects that is coupled to at least one die interconnect among the plurality of die interconnects, is coupled to at least one second ETS interconnect among the one or more second ETS interconnects that is coupled to at least one second die interconnect among the plurality of second die interconnects.

21. The IC package of clause 15, wherein the substrate comprises a cored substrate.

22. The IC package of clause 15, wherein the substrate comprises a coreless substrate.

23. The IC package of clause 15 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

24. A method of fabricating a substrate for an integrated circuit (IC) package, comprising:
  forming a substrate comprising an upper substrate metallization layer comprising one or more substrate metal interconnects; and
  forming an embedded trace substrate (ETS) layer coupled to the substrate, the ETS layer comprising an ETS interconnect layer adjacent to the upper substrate metallization layer of the substrate, the ETS interconnect layer comprising one or more ETS interconnects; and
  disposing the ETS layer on the substrate adjacent to the upper substrate metallization layer coupling each ETS interconnect among the one or more ETS interconnects coupled to a substrate metal interconnect among the one or more substrate metal interconnects in the upper substrate metallization layer of the substrate.

25. The method of clause 24, further comprising forming one or more metal pillar interconnects coupled to an ETS interconnect among the one or more ETS interconnects and coupled to a substrate metal interconnect among the one or more substrate metal interconnects.

26. The method of clause 25, wherein forming the one or more metal pillar interconnects further comprises forming the one or more metal pillar interconnects for a first surface of the one or more metal pillar interconnects to extend a distance from an ETS interconnect layer outer surface of the ETS interconnect layer.

27. The method of clause 26, wherein forming the one or more metal pillar interconnects extending the distance from the ETS interconnect layer outer surface of the ETS interconnect layer further comprises forming the one or more metal pillar interconnects through the one or more ETS interconnects and coupled to the substrate metal interconnect among the one or more substrate metal interconnects in the upper substrate metallization layer of the substrate.

28. The method of clause 24, further comprising:
  forming a dielectric laminate; and
  laminate bonding the ETS layer to the substrate using the dielectric laminate.

29. The method of clause 26, wherein forming the one or more metal pillar interconnects comprises:
  forming one or more first openings through the ETS interconnect down to an outer surface of the one or more substrate metal interconnects;
  disposing a metal material in the one or more first openings to form one or more vertical interconnect accesses (vias) of the one or more metal pillar interconnects coupled to the one or more ETS interconnects and the one or more substrate metal interconnects;
  forming a post on each side of the one or more first openings to form one or more second openings above the respective one or more first openings, the post on each side of the one or more first openings each disposed a second distance above the ETS interconnect layer outer surface, and
  disposing a second metal material in the one or more second openings coupled to the one or more vias to form the one or more metal pillar interconnects.

30. The method of clause 29, wherein forming the one or more first openings comprises laser etching the one or more first openings through the ETS interconnect down to a top surface of the one or more substrate metal interconnects.

31. The method of clause 26, further comprising:
  disposing a solder resist layer on the ETS interconnect layer; and
  thinning the solder resist layer to expose the first surface of the one or more metal pillar interconnects from the solder resist layer.

32. The method of clause 26, wherein forming the one or more metal pillar interconnects comprises:
  forming the one or more first openings through the ETS interconnect down to an outer surface of the one or more substrate metal interconnects;
  forming a first and second post on each respective side of the one or more first openings to form one or more second openings above the respective one or more first openings, the first and second post each disposed a second distance above the ETS interconnect layer outer surface; and
  disposing a metal material in the one or more second openings and the one or more first opening to form the one or more metal pillar interconnects in the respective one or more first openings and the one or more second openings.

33. The method of clause 32, wherein forming the one or more first openings comprises laser etching the one or more first openings through the ETS interconnect down to a top surface of the one or more substrate metal interconnects.

What is claimed is:

1. A package substrate for an integrated circuit (IC) package, comprising:
  a substrate, comprising:
    an upper substrate metallization layer comprising one or more substrate metal interconnects; and
    an embedded trace substrate (ETS) interconnect layer adjacent to the upper substrate metallization layer of the substrate, the ETS interconnect layer comprising one or more ETS interconnects embedded in a dielectric material, wherein the one or more ETS interconnects each have an ETS interconnect outer surface that is flush with an outer surface of the dielectric material;
    each ETS interconnect among the one or more ETS interconnects coupled to a corresponding substrate metal interconnect among the one or more substrate metal interconnects in the upper substrate metallization layer of the substrate; and
  one or more metal pillar interconnects, wherein each one or more metal pillar interconnects are coupled to an ETS interconnect among the one or more ETS interconnects, and to the corresponding substrate metal interconnect among the one or more substrate metal interconnects,
  wherein:
    the ETS interconnect layer comprises an ETS interconnect layer outer surface;
    the one or more ETS interconnects are adjacent to the ETS interconnect layer outer surface; and the one or more metal pillar interconnects each comprises a first surface extending a distance from the ETS interconnect layer outer surface.

2. The package substrate of claim 1, wherein the substrate comprises a cored substrate.

3. The package substrate of claim 1, wherein the substrate comprises a coreless substrate.

4. The package substrate of claim 1, wherein a line-spacing ratio (L/S) of each ETS interconnect among the one or more ETS interconnects is less than 5.0/5.0.

5. The package substrate of claim 1, wherein the distance of a portion of the one or more metal pillar interconnects extending from the ETS interconnect layer outer surface is equal to or greater than five (5) micrometers (um).

6. The package substrate of claim 1, wherein each of the one or more metal pillar interconnects extends through the one or more ETS interconnects and is coupled to the corresponding substrate metal interconnect among the one or more substrate metal interconnects in the upper substrate metallization layer of the substrate.

7. The package substrate of claim 1, wherein each of the one or more metal pillar interconnects comprises a second surface coupled to the corresponding substrate metal interconnect among the one or more substrate metal interconnects in the upper substrate metallization layer of the substrate.

8. The package substrate of claim 7, wherein each of the one or more metal pillar interconnects has a thickness of a second distance equal to or greater than ten (10) micrometers (μm) between the first surface of each of the one or more metal pillar interconnects and the second surface of each of the one or more metal pillar interconnects.

9. The package substrate of claim 1, wherein a ratio of a thickness of the one or more metal pillar interconnects to a thickness of the ETS interconnect layer is at least 1.4.

10. The package substrate of claim 1, wherein a line-spacing ratio (L/S) of the one or more metal pillar interconnects is less than 5.0/5.0.

11. The package substrate of claim 1, further comprising a solder resist layer comprising a second surface and a third surface coupled to the ETS interconnect layer, at least one of the one or more metal pillar interconnects further extending through the solder resist layer and further extending a second distance above the second surface of the solder resist layer.

12. The package substrate of claim 1, wherein:
the substrate further comprises at least one additional substrate metallization layer adjacent to the upper substrate metallization layer, wherein the upper substrate metallization layer is disposed between the ETS interconnect layer and the at least one additional substrate metallization layer; and
each of the at least one additional substrate metallization layer comprises one or more additional substrate metal interconnects; and
at least one of the one or more additional substrate metal interconnects are coupled to at least one of the one or more substrate metal interconnects in the upper substrate metallization layer.

13. An integrated circuit (IC) package, comprising:
a package substrate, comprising:
a substrate, comprising:
an upper substrate metallization layer comprising one or more substrate metal interconnects; and
an embedded trace substrate (ETS) interconnect layer adjacent to the upper substrate metallization layer of the substrate, the ETS interconnect layer comprising one or more ETS interconnects embedded in a dielectric material, wherein the one or more ETS interconnects each have an ETS interconnect surface that is flush with an outer surface of the dielectric material; and
each ETS interconnect among the one or more ETS interconnects coupled to a corresponding substrate metal interconnect among the one or more substrate metal interconnects in the upper substrate metallization layer of the substrate; and
a die coupled to at least one ETS interconnect among the one or more ETS interconnects in the ETS interconnect layer; and
one or more metal pillar interconnects each coupling an ETS interconnect among the one or more ETS interconnects to the corresponding substrate metal interconnect among the one or more substrate metal interconnects,
wherein:
the ETS interconnect layer comprises an ETS interconnect layer outer surface;
the one or more ETS interconnects are adjacent to the ETS interconnect layer outer surface; and
the one or more metal pillar interconnects each comprises a first surface extending a distance from the ETS interconnect layer outer surface.

14. The IC package of claim 13, wherein:
the one or more ETS interconnects comprise a plurality of ETS interconnects;
a plurality of die interconnects coupled to the die; and
each die interconnect among the plurality of die interconnects is coupled to an ETS interconnect among the plurality of ETS interconnects.

15. The IC package of claim 14, wherein:
the upper substrate metallization layer further comprises one or more second substrate metal interconnects; and
the ETS interconnect layer comprises one or more second ETS interconnects;
each second ETS interconnect among the one or more second ETS interconnects coupled to a second substrate metal interconnect among the one or more second substrate metal interconnects in the upper substrate metallization layer of the substrate; and
further comprising:
a second die;
a plurality of second die interconnects coupled to the second die;
each second die interconnect among the plurality of second die interconnects coupled to a second ETS interconnect among the one or more second ETS interconnects; and
at least one ETS interconnect among the one or more ETS interconnects that is coupled to at least one die interconnect among the plurality of die interconnects, is coupled to at least one second ETS interconnect among the one or more second ETS interconnects that is coupled to at least one second die interconnect among the plurality of second die interconnects.

16. The IC package of claim 13, wherein each of the one or more metal pillar interconnects comprises a second surface coupled to the corresponding substrate metal interconnect among the one or more substrate metal interconnects in the upper substrate metallization layer of the substrate.

17. The IC package of claim 13, wherein the substrate comprises a cored substrate.

18. The IC package of claim 13, wherein the substrate comprises a coreless substrate.

19. The IC package of claim 13 integrated into a device selected from the group consisting of: a set top box; an entertainment unit; a navigation device; a communications device;
- a fixed location data unit; a mobile location data unit; a global positioning system (GPS) device; a mobile phone; a cellular phone; a smart phone; a session initiation protocol (SIP) phone; a tablet;
- a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

* * * * *